(12) United States Patent
Derkits

(10) Patent No.: US 9,388,962 B2
(45) Date of Patent: Jul. 12, 2016

(54) LED SPOTLIGHT HAVING A REFLECTOR

(75) Inventor: Christian Derkits, St. Michael (AT)

(73) Assignee: Tridonic Jennersdorf GmbH, Jennersdorf (AT)

( * ) Notice: Subject to any disclaimer, the term of this patent is extended or adjusted under 35 U.S.C. 154(b) by 212 days.

(21) Appl. No.: 13/878,359

(22) PCT Filed: Oct. 11, 2011

(86) PCT No.: PCT/EP2011/067673
§ 371 (c)(1),
(2), (4) Date: Jun. 14, 2013

(87) PCT Pub. No.: WO2012/049137
PCT Pub. Date: Apr. 19, 2012

(65) Prior Publication Data
US 2013/0258673 A1    Oct. 3, 2013

(30) Foreign Application Priority Data

Oct. 15, 2010  (DE) .......................... 10 2010 042 516
Nov. 25, 2010  (DE) .......................... 10 2010 061 972

(51) Int. Cl.
F21V 7/20    (2006.01)
F21V 13/04   (2006.01)
F21K 99/00   (2016.01)
(Continued)

(52) U.S. Cl.
CPC ................. *F21V 13/04* (2013.01); *F21K 9/137* (2013.01); *F21K 9/54* (2013.01); *F21V 7/0025* (2013.01); *F21V 29/505* (2015.01); *F21V 29/773* (2015.01); *F21V 29/83* (2015.01); *F21Y 2101/02* (2013.01); *F21Y 2113/007* (2013.01); *H01L 25/0753* (2013.01); *H01L 33/60* (2013.01); *H01L 2924/0002* (2013.01)

(58) Field of Classification Search
CPC ............... F21K 9/50; F21K 9/54; F21V 7/00; F21V 7/0025; F21V 7/20; F21V 7/22; F21V 7/048; F21V 7/06; F21V 9/16; F21V 13/04; G02F 1/133603–1/133611; G02F 1/133614
USPC ................. 362/230, 231, 234, 235, 240, 241, 362/249.02, 253, 84, 293, 294, 296.01, 310, 362/341, 345, 350
See application file for complete search history.

(56) References Cited

U.S. PATENT DOCUMENTS

2004/0217364 A1* 11/2004 Tarsa et al. ...................... 257/89
2008/0025047 A1    1/2008 Speier et al.
(Continued)

OTHER PUBLICATIONS

Translation of International Preliminary Report on Patentability issued in connection with the corresponding International Application No. PCT/EP2011/067673 on Apr. 16, 2013.
(Continued)

*Primary Examiner* — Peggy Neils
*Assistant Examiner* — Alexander Garlen
(74) *Attorney, Agent, or Firm* — The H.T. Than Law Group

(57) ABSTRACT

The invention relates to a LED spotlight, preferably for white light, comprising—an LED module having several LED chips on a carrier,—a cooling body that is in thermal contact with the LED module,—a reflector that laterally surrounds the LED chips, and—a light mixing chamber arranged within the reflector and laterally surrounding the LED chips, the light mixing chamber base surface and the reflector bottom being located on the same plane.

21 Claims, 4 Drawing Sheets

(51) Int. Cl.
*F21V 7/00* (2006.01)
*F21Y 101/02* (2006.01)
*H01L 25/075* (2006.01)
*H01L 33/60* (2010.01)
*F21Y 113/00* (2016.01)
*F21V 29/505* (2015.01)
*F21V 29/77* (2015.01)
*F21V 29/83* (2015.01)

(56) References Cited

U.S. PATENT DOCUMENTS

| | | |
|---|---|---|
| 2008/0030993 A1 | 2/2008 | Narendran et al. |
| 2008/0054281 A1* | 3/2008 | Narendran et al. ............. 257/98 |
| 2008/0117500 A1* | 5/2008 | Narendran et al. ........... 359/326 |
| 2008/0310158 A1* | 12/2008 | Harbers et al. ................ 362/240 |
| 2010/0053959 A1* | 3/2010 | Ijzerman et al. ............... 362/235 |
| 2010/0165599 A1* | 7/2010 | Allen .............................. 362/84 |
| 2011/0051394 A1* | 3/2011 | Bailey ............................ 362/84 |
| 2012/0020083 A1* | 1/2012 | Tukker et al. ................. 362/235 |

OTHER PUBLICATIONS

International Search Report issued in connection with the corresponding International Application No. PCT/EP2011/067673 on Jul. 4, 2012.

* cited by examiner

LED SPOTLIGHT HAVING A REFLECTOR

BACKGROUND OF THE INVENTION

LED spotlights, in particular to achieve white light illumination, are well known from the prior art. An LED spotlight is typically to be understood as an LED light source which has one or more LEDs of identical and different colors, wherein the light of the one or more LEDs receives the desired distribution by way of a reflector.

A special set of problems occurs if LEDs having different emission spectra are used as the light source. Specifically, it must be ensured that sufficient mixing of the light occurs before the mixed light from the various LEDs exits from the spotlight, so that sufficient color homogeneity of the emitted light can be achieved over the entire angular range of the emitted light as much as possible.

The problem of color homogeneity can be strengthened still further if the spectrum of at least one of the LEDs of the LED light source is partially converted into a light having different (normally lower-frequency) light by a color conversion layer, which is applied at a distance to and/or in contact with the LED, such that the color conversion layer represents a third light source in a certain sense, which must be homogeneously mixed with the light emitted from the LEDs.

A spotlight having an LED light source and a reflector is already known from WO 02/5047472. An LED light source is arranged on the reflector bottom therein and fills up a lower section of the reflector internal volume.

It is therefore the object of the invention to propose an LED spotlight which achieves better light mixing, in order to thus improve the color homogeneity.

SUMMARY OF THE INVENTION

This object is achieved by the features of the independent claims. The dependent claims refine the central ideas of the invention in a particularly advantageous manner.

A first aspect of the invention relates to an LED spotlight, preferably for white light, having:
  an LED module having several LED chips on a carrier,
  a cooling body which is in thermal contact with the LED module,
  a reflector which laterally surrounds the LED chips, and
  a light mixing chamber which is arranged within the reflector and laterally surrounds the LED chips,
  wherein the light mixing chamber base surface and the reflector bottom are located on the same plane.

The reflector bottom can have a central opening, through which the LED chips protrude into the light mixing chamber originating from the carrier of the LED module arranged below the reflector bottom.

A cylinder attachment, which is preferably integrally formed with the reflector bottom, and which encloses the light mixing chamber, can extend away from the reflector bottom.

The light mixing chamber and the reflector can be placed on the carrier of the LED module.

The light mixing chamber and the reflector can be embodied separately or integrated.

The LED chips can be covered using a color conversion layer.

The LED chips can be covered using a globe top, which is applied by a dispensing method, for example, or another cover.

The LED chips can be monochromatic LED chips of the same color or of different colors.

The LED chips can have:
  at least one blue or UV LED, the light of which is partially converted into light having another wavelength by a color conversion layer, which is arranged above and preferably in direct contact with all LEDs, wherein the mixed light is preferably in the white spectrum, and
  at least one further LED, the light of which is substantially not converted by the color conversion layer.

The inner lateral surface of the reflector and/or the light mixing chamber can have a parabolic curve or a linear curve or can be formed at least partially in the form of facets.

The inner lateral surface of the reflector and the side of the light mixing chamber facing toward the LED chips can be formed to be reflective and/or scattering. For example, they can be metal-coated, can have a reflective coating (white), can have facets, etc.

The reflector bottom and/or the base surface of the mixing chamber can be shaped circular, elliptical, or square.

The light mixing chamber and/or the reflector can be covered by a scattering disc or can be open.

The light mixing chamber and/or the reflector can be covered by a color conversion disc.

The LED spotlight can be formed as a ceiling spotlight for installation in suspended ceilings.

The LED spotlight can be formed as a retrofit LED reflector lamp and can be equipped, for example, with a commercially available socket, for example, E27, E14, etc.

The cooling body can have a central depression for accommodating the LED module.

The cooling body can preferably at least partially follow the outer side of the reflector in planar contact, preferably in the form of cooling ribs.

A further aspect of the invention relates to an LED spotlight, preferably for white light, having:
  an LED module having several LED chips on a carrier,
  a cooling body which is in thermal contact with the LED module,
  a reflector which laterally surrounds the LED chips, and
  a light mixing chamber which is arranged within the reflector and laterally surrounds the LED chips,
  wherein a cylinder attachment, which is preferably integrally formed with the reflector bottom, and which directly or indirectly surrounds the light mixing chamber, extends away from the reflector bottom.

Still a further aspect of the invention relates to an LED spotlight, preferably for white light, having:
  an LED module having several LED chips on a carrier,
  a cooling body which is in thermal contact with the LED module,
  a reflector which laterally surrounds the LED chips, and
  a light mixing chamber which is arranged within the reflector and laterally surrounds the LED chips,
  wherein the light mixing chamber walls and the reflector bottom are (directly) placed on the carrier of the LED module.

Finally, the invention also relates to a method for improving the color homogeneity of a white light LED spotlight, having the following steps:
  premixing of light of several LEDs and optionally of color conversion material in a mixing chamber, which is laterally delimited by reflecting walls and is partially not filled,
  conducting the light out of the mixing chamber into the internal volume of a reflector, which outputs the light on its outlet side.

BRIEF DESCRIPTION OF THE DRAWINGS

Further features, advantages, and properties of the invention will now be explained in greater detail with reference to the figures of the appended drawings.

DETAILED DESCRIPTION OF THE INVENTION

Figure 1:
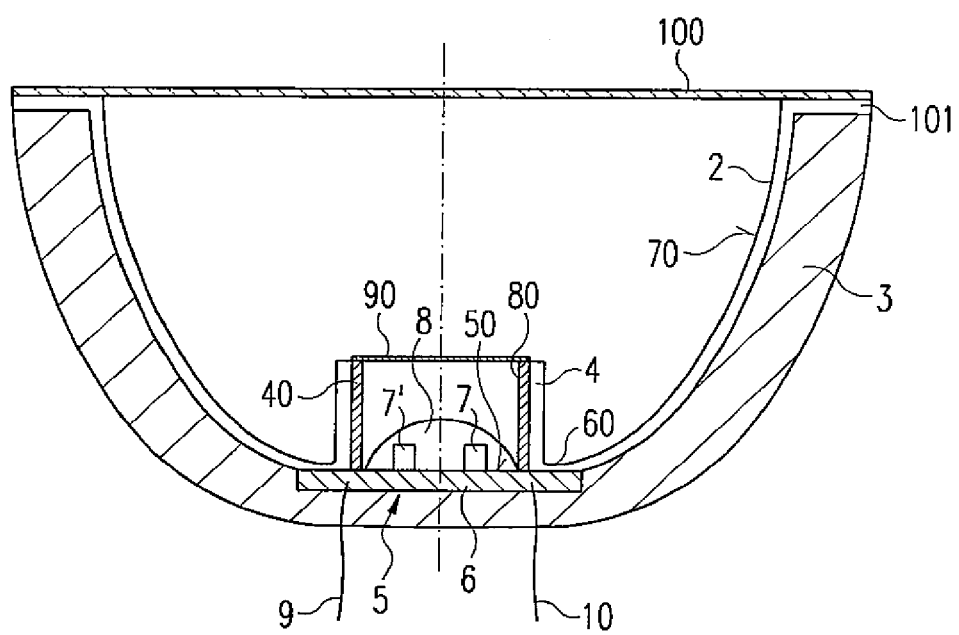
FIG. 1 shows a cross-sectional view of an LED spotlight according to the invention.

FIG. 1 shows a cross-sectional view of an LED spotlight according to the invention. The LED light source is preferably formed by several LEDs 7, 7', which are arranged on a carrier 5 to thus form an LED module 6.

The LED module 6 is in thermal contact with a cooling body 3. In the illustrated example, the LED module 6, and more precisely the carrier 5, is placed in a central region of the cooling body 3, which is embodied as fan-shaped in the sectional view, or preferably introduced into a central depression of the cooling body bottom.

In the illustrated example, a transmissive layer 8, which can contain color conversion material and/or scattering particles, and which is applied by a dispensing method, is applied in direct contact with one or all LEDs 7, 7'.

A color conversion material is to be understood in the scope of the present description and claims as one or a plurality of color conversion materials. These color conversion materials can be, for example, green, yellow, yellow/green, red, or an arbitrary mixture of two or more of these color conversion materials of identical and/or different colors.

As shown, the LED module 6 is arranged such that it is inserted through a central opening of the bottom 60 of a reflector 2 from the outside, in such a manner that at least a part of the LEDs 6, 7', but preferably the entire lateral face of the LEDs 7, 7' protrudes into the interior of the reflector 2. The LEDs 7, 7' are surrounded by a light mixing chamber 40.

The light mixing chamber has preferably reflective mixing chamber walls 40, which are formed in the illustrated example as an independent, for example, annular component of an internal cylinder attachment 4 of the reflector 2, which is embodied in an illustrated example integrally with the reflector bottom 60. Alternatively, the mixing chamber walls 40 can be embodied as scattering and/or scattering-reflective.

The mixing chamber walls 40 and the reflector 2 are placed on the carrier 6 of the LED module 5. The bottoms of the mixing chamber and the reflector are located on one plane according to the illustrated exemplary embodiment, and are thus arranged aligned in the side view.

Alternatively (not shown), the light mixing chamber can be offset to the rear. In this case, the bottom of the mixing chamber is thus offset to the rear in relation to the reflector bottom. The LEDs can also all be located behind the plane formed by the reflector bottom. For example, the outlet side of the mixing chamber, which is located in the light emission direction, can be located on the plane of the reflector bottom or can protrude slightly into the reflector interior.

The mixing chamber walls 40 can be laterally spaced apart from the dispensed layer 8, or can be in contact therewith.

The mixing chamber is partially unfilled, i.e., it contains an air layer between the LEDs 7, 7' or the optional dispensed layer 8 and the outlet plane (defined by the edge of the mixing chamber walls), respectively.

The inner side of the walls (in the example 40) delimiting the light mixing chamber is preferably embodied as reflective and/or scattering. Therefore, premixing of the light from the LEDs 7, 7' and optionally of the color conversion material in the dispensed layer 8 will occur in the light mixing chamber, before this mixed light reaches the actual reflector interior volume delimited by the inner lateral surface 70 of the reflector 2.

As schematically shown in FIG. 1, the light mixing chamber can be delimited in the light emission direction of the LEDs 7, 7' by a light-transmissive cover 90, which can contain conversion material and/or novel particles.

This cover 90 is thus an example that color conversion material can be arranged in the light emission direction, but at a distance to the LEDs 7, 7'. A mixing chamber which is not filled up, i.e., only contains air, can be located between this color conversion material and the LEDs 7, 7'.

The dispensed layer 8 is only an example of how color conversion material and/or scattering material can be provided in direct contact with at least one or also all LEDs 7, 7'.

Alternatively or additionally, the reflector 2 can also be terminated as a whole by a light-transmissive cover 100 in the light emission direction, wherein this cover 100 can also contain conversion material and/or scattering material.

As is already obvious from the cross-sectional view of FIG. 1, the cooling body 3, which is preferably formed in a cup shape, can follow the curve of the outer contour of the reflector 2. The edge of the reflector 2 can end in a flange region 101, which covers the cooling body 3 on top. As schematically shown in FIG. 1, the electrical supply of the LEDs 7, 7' can occur through the cooling body bottom by means of electrical contacts 9, 10.

Figure 2:
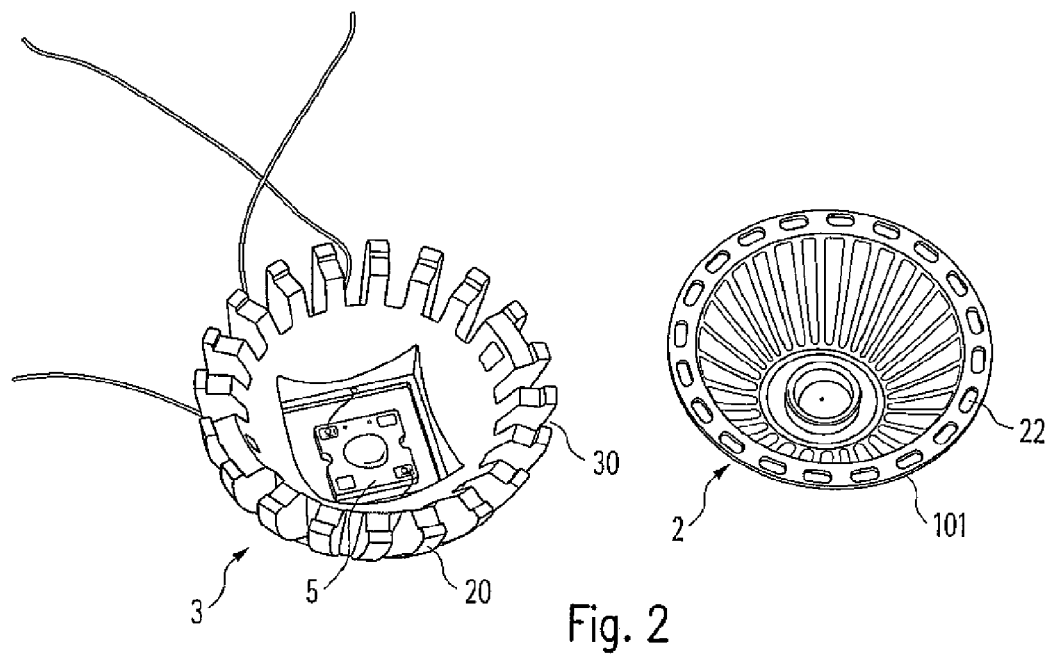
FIG. 2 shows the cooling body and the reflector of the LED spotlight.

The cooling body 3 and the reflector 2 are separately shown in FIG. 2.

The LED module 5 is accommodated as shown in a central depression, which is substantially square here, of the cooling body 3.

The side wall of the cup-shaped cooling body 3 has cooling ribs 20, which are spaced apart by chimney-like cavities 30. At least in a lower region (i.e., in the direction of the closed base surface), the cooling ribs 20 can be connected by wall surfaces, which are offset radially inward. In the upper region, the cooling ribs can be freestanding like fingers, such that the reflector outer wall is thus partially exposed to the outside in a side view.

As is also apparent in FIG. 2, the flange region 101 of the reflector has recesses 22, which are preferably arranged aligned with the chimney-like extensions 30 of the cooling body, in order (if the reflector is inserted into the cup-like cooling body 3), for example, not to block the air circulation promoted by convection in these chimney-like recesses 30 of the cooling body 3.

Figure 3:
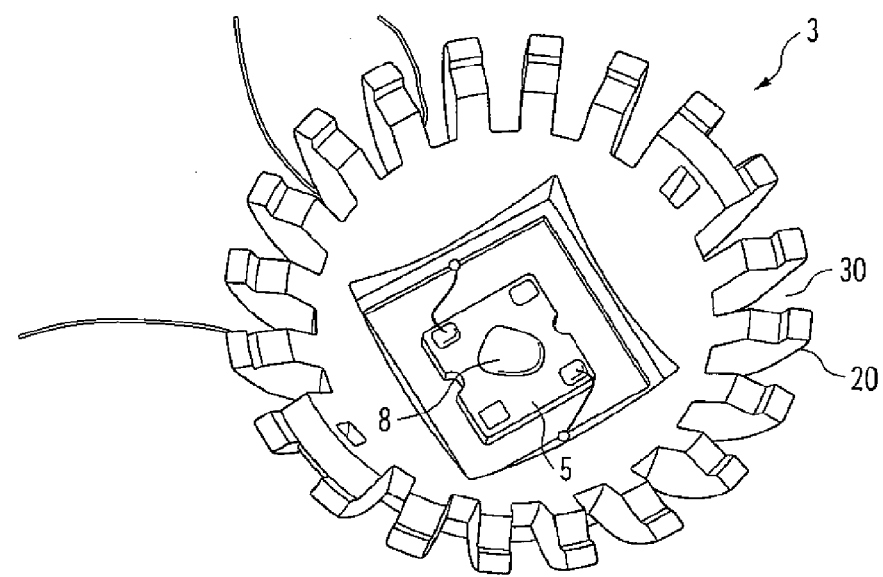
FIG. 3 shows the cooling body in detail.

FIG. 3 is a more detailed view of the cup-shaped cooling body 3.

Figure 4:
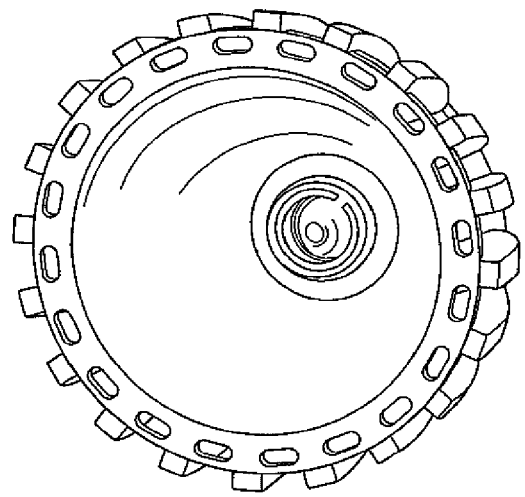
FIG. 4 shows an exploded view of reflector, mixing chamber wall, LED module, and cooling body.
Figure 4:
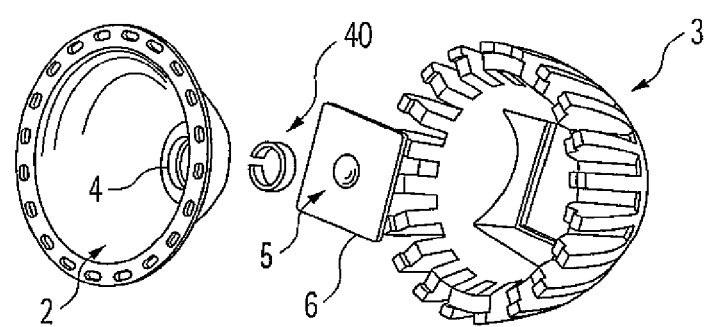
Figure 5:
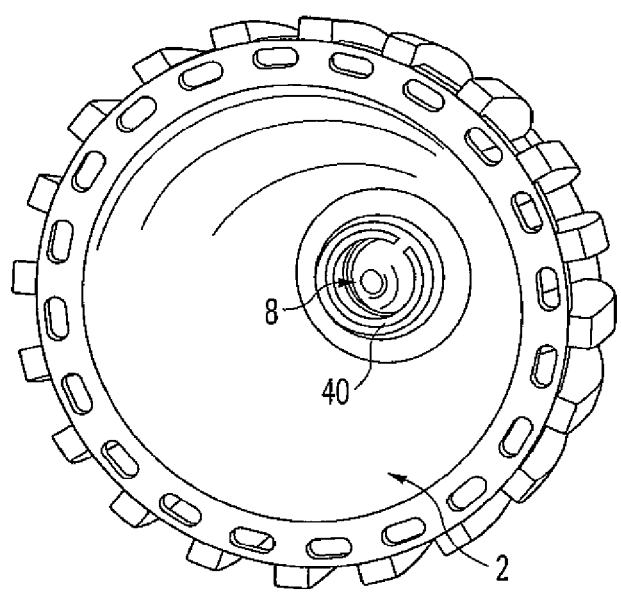
FIG. 5 shows the reflector having LEDs, which are inserted through from below and are coated using a dispensed layer.

It can be seen in the exploded view in FIG. 4 that the mixing chamber wall 40 can be inserted as a separate component into the cylinder connecting piece 4 of the reflector 2, for example, and can be placed on the carrier 6 of the LED module 5.

Overall, as is apparent in FIG. 4, the reflector can also be placed on the carrier 6 of the LED module 5 to surround the LEDs 6, 7.

The invention claimed is:

1. An LED spotlight, preferably for white light, having:
   an LED module (5) having several LED chips (7, 7') on a carrier (6), wherein a color conversion layer is applied in direct contact with the LED chips,
   a cooling body (3) which is in thermal contact with the LED module (5),
   a reflector (2) which laterally surrounds the LED chips (7, 7'), and a light mixing chamber (40) which is arranged within the reflector (3) and laterally surrounds the LED chips (7, 7'), wherein the light mixing chamber base surface (50) and the reflector bottom (60) are located on the same plane wherein the lateral side (80) of the light mixing chamber (40) facing toward the LED chips (7, 7') is formed to be reflective, or reflective and scattering, wherein the light mixing chamber (40) is open at a top thereof, and wherein a cylinder attachment (4), which is integrally formed with the reflector bottom and laterally encloses the light mixing chamber (40), extends away from the reflector bottom (60) towards the top of the light mixing chamber.

2. The LED spotlight as claimed in claim 1, wherein the reflector bottom (60) has a central opening, through which the LED chips (7, 7') protrude into the light mixing chamber (40) originating from the carrier (6) of the LED module (5) arranged below the reflector bottom (60).

3. The LED spotlight as claimed in claim 1, wherein the light mixing chamber (40) and the reflector (2) are placed on the carrier (6) of the LED module (5).

4. The LED spotlight as claimed in claim 1, wherein the light mixing chamber (40) and the reflector (2) are embodied separately or integrated.

5. The LED spotlight as claimed in claim 1, wherein the LED chips (7, 7') are covered by the color conversion layer (8).

6. The LED spotlight as claimed in claim 1, wherein the LED chips (7, 7') are covered using a globe top (8), which is applied by a dispensing method—or another cover.

7. The LED spotlight as claimed in claim 1, wherein the LED chips (7, 7') are monochromatic of the same color or of different colors.

8. The LED spotlight as claimed in claim 1, wherein the several LED chips (7, 7') comprise:
a first blue or UV LED, the light of which is partially converted into light having another wavelength by the color conversion layer, which is arranged above and in direct contact with all LEDs (7, 7'), wherein the mixed light is preferably in the white spectrum, and
a second LED, the light of which is substantially not converted by the color conversion layer.

9. The LED spotlight as claimed in claim 1, wherein the inner lateral surface (70) of the reflector (2) or the light mixing chamber (40) has a parabolic curve or a linear curve or is formed at least partially in the form of facets.

10. The LED spotlight as claimed in claim 1, wherein the inner lateral surface (70) of the reflector (2) is formed to be reflective or scattering.

11. The LED spotlight as claimed in claim 1, wherein the reflector bottom (60) or the base surface (50) of the mixing chamber (40) is shaped circular, elliptical, or square.

12. The LED spotlight as claimed in claim 1, wherein the reflector (2) is covered by a scattering disc (100) or is open.

13. The LED spotlight as claimed in claim 1, wherein the reflector (2) is covered by a color conversion disc.

14. The LED spotlight as claimed in claim 1, wherein the LED spotlight is formed as a ceiling spotlight for installation in suspended ceilings.

15. The LED spotlight as claimed in claim 1, wherein the LED spotlight is formed as a retrofit LED reflector lamp and is equipped with a commercially available E27 or E14 socket.

16. The LED spotlight as claimed in claim 1, characterized in that the cooling body (3) has a central depression for accommodating the LED module.

17. The LED spotlight as claimed in claim 1, wherein the cooling body at least partially follows the outer side of the reflector in planar contact.

18. The LED spotlight as claimed in claim 17, wherein the cooling body at least partially follows the outer side of the reflector in planar contact in the form of cooling ribs.

19. The LED spotlight as claimed in claim 1, wherein the light mixing chamber (40) has a cylindrical shape.

20. An LED spotlight, preferably for white light, having:
an LED module (5) having several LED chips (7, 7') on a carrier (6), wherein a color conversion layer is applied in direct contact with LED chips,
a cooling body (3) which is in thermal contact with the LED module (5),
a reflector (2) which laterally surrounds the LED chips (7, 7'), and
a light mixing chamber (40) which is arranged within the reflector (3) and laterally surrounds the LED chips (7, 7'),
wherein a cylinder attachment (4), which is integrally formed with the reflector bottom, and which laterally surrounds the light mixing chamber (40), extends away from the reflector bottom (60) towards a to of the light mixing chamber,
wherein the lateral side (80) of the light mixing chamber (40) facing toward the LED chips (7, 7') is formed to be reflective, or reflective and scattering, and
wherein the light mixing chamber (40) is open at the top thereof.

21. An LED spotlight, preferably for white light having:
an LED module (5) having several LED chips (7, 7') on a carrier (6), wherein a color conversion layer is applied in direct contact with the LED chips,
a cooling body (3) which is in thermal contact with the LED module (5),
a reflector (2) which laterally surrounds the LED chips (7, 7'), and
a cylindrical shaped light mixing chamber (40) which is arranged within the reflector (3) and laterally surrounds the LED chips (7, 7'),
wherein the light mixing chamber walls (40) and the reflector bottom (60) are placed directly on the carrier (6) of the LED module (5),
wherein the lateral side (80) of the light mixing chamber (40) facing toward the LED chips (7, 7') is formed to be reflective, or reflective and scattering,
wherein the light mixing chamber (40) is open at a to thereof, and
wherein a cylinder attachment (4), which is integrally formed with the reflector bottom and laterally encloses the light mixing chamber (40), extends away from the reflector bottom (60) towards the top of the light mixing chamber.

* * * * *